(12) United States Patent
Ihara

(10) Patent No.: US 7,385,270 B2
(45) Date of Patent: Jun. 10, 2008

(54) SEMICONDUCTOR DEVICE AND MANUFACTURING METHOD THEREOF

(75) Inventor: Hisanori Ihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 11/305,091

(22) Filed: Dec. 19, 2005

(65) Prior Publication Data
US 2006/0132632 A1 Jun. 22, 2006

(30) Foreign Application Priority Data
Dec. 22, 2004 (JP) ............................. 2004-371903

(51) Int. Cl.
H01L 27/146 (2006.01)
(52) U.S. Cl. ...................... 257/435; 257/291; 257/292; 257/462; 257/E27.133
(58) Field of Classification Search ................ 257/291, 257/292, 435, 462, E27.133
See application file for complete search history.

(56) References Cited

U.S. PATENT DOCUMENTS 6,303,919 B1* 10/2001 Yokomichi et al. ...... 250/208.1
6,448,596 B1* 9/2002 Kawajiri et al. ............ 257/292
6,483,163 B2* 11/2002 Isogai et al. ................ 257/446
6,512,547 B1* 1/2003 Miida .......................... 348/310
6,642,087 B2* 11/2003 Nozaki et al. .............. 438/149
6,677,627 B2* 1/2004 Miida ......................... 257/292
6,812,539 B1* 11/2004 Rhodes ....................... 257/435
7,126,102 B2* 10/2006 Inoue et al. ............ 250/214 R
7,157,758 B2* 1/2007 Mizuguchi ................... 257/292
7,242,043 B2* 7/2007 Ohkawa ...................... 257/292

FOREIGN PATENT DOCUMENTS

JP 2001-150849 5/2000

* cited by examiner

Primary Examiner—Evan Pert
Assistant Examiner—Victor A. Mandala, Jr.
(74) Attorney, Agent, or Firm—Oblon, Spivak, McClelland, Maier & Neustadt, P.C.

(57) ABSTRACT

A solid-state imaging device achieving a global shutter of images and its manufacturing method are disclosed. According to one aspect of the present invention, it is provided a solid-state imaging device comprising an optical signal storage region provided in a semiconductor substrate, a signal detecting region provided in the semiconductor substrate apart from the optical signal storage region, a transistor electrically connecting the optical signal storage region with the signal detecting region, a wiring connected with the signal detecting region, and a light shielding film provided in close proximity to the signal detecting region and over the signal detecting region.

5 Claims, 12 Drawing Sheets

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2004-371903, filed on Dec. 22, 2004, the entire contents of which are incorporated herein by reference.

BACKGROUND OF THE INVENTION

1. Field of the Invention

The present invention relates to a solid-state imaging device and a manufacturing method thereof, and more particularly, to a metal semiconductor silicon solid-state imaging device and a manufacturing method thereof.

2. Description of the Related Art

An amplifying type metal semiconductor silicon (MOS) solid-state imaging device having an amplifying function is suitable for a reduction in a pixel size and an increase in the number of pixels, and hence expansion of its applications is anticipated. Further, the amplifying type MOS imaging device is anticipated greatly since it has smaller power consumption than a charge coupled device (CCD) type imaging device which is extensively used in general and it is basically manufactured in a complementary MOS (CMOS) process, and hence it can be readily integrated with any other CMOS circuit.

FIG. 1 shows an example of a circuit configuration 100 of a pixel cell in an amplifying type MOS solid-state imaging device. As illustrated in the drawing, the amplifying type MOS solid-state imaging device comprises a photodiode (an optical signal storage region) 102, a read transistor 104, an amplifying transistor 106, a reset transistor 108, and others. The photodiode 102 stores a signal as a photoelectric converting section, the read transistor 104 reads the signal as a signal scanning circuit section, the amplifying transistor 106 amplifies the signal, and the reset transistor 108 resets a signal charge in the photodiode 102. By turning on the read transistor 104, a signal stored in the photodiode 102 is read into a drain (a signal detecting region) 104D of the read transistor 104. The signal detecting region 104D is connected with a gate of the amplifying transistor 106. A drain of the amplifying transistor 106 is connected with a power supply $V_{DD}$. When a vertical selection transistor 110 is selected (on), the power supply voltage $V_{DD}$ is amplified to a potential corresponding to an amount of the electric charge in the signal detecting region 104D and the amplified potential is output to a vertical signal line 112. Such a signal detecting operation is sequentially performed with respect to two-dimensionally arranged pixel cells, thereby obtaining one image.

An example of an imaging device including the above-described circuit is disclosed in Jpn. Pat. Appln. KOKAI Publication No. 2000-150849. In this example, a photodiode is provided in a semiconductor substrate. Light enters the photodiode through a window of a second light shielding film provided above the semiconductor substrate. An electric charge corresponding to an optical signal stored in the photodiode is transferred to a drain (a signal detecting region) of a read transistor in a predetermined cycle, and held for a predetermined time period. The held electric charge is sequentially read out as an image information. During this holding period, stray light might enter the drain (the signal detecting region) of the read transistor through various optical paths. For example, light which has fallen on a gate electrode around the photodiode, e.g., a gate electrode of the read transistor, may be reflected by, e.g., a lower surface of the second light shielding film, and may stray and enter the signal detecting region. Such a stray light causes a change in the electric charge (i.e., image signal) held in the signal detecting region. That is, it can be a cause of a phenomenon called crosstalk.

Occurrence of crosstalk fails to read information of each pixel cell obtained in the same time period, i.e., a global shutter of images. Achieving the global shutter is an important task for the solid-state imaging device.

BRIEF SUMMARY OF THE INVENTION

According to one aspect of the present invention, it is provided a solid-state imaging device comprising: an optical signal storage region provided in a semiconductor substrate; a signal detecting region provided in the semiconductor substrate apart from the optical signal storage region; a transistor electrically connecting the optical signal storage region with the signal detecting region; a wiring connected with the signal detecting region; and a light shielding film provided in close proximity to the signal detecting region and over the signal detecting region.

According to another aspect of the present invention, it is provided a manufacturing method of a solid-state imaging device, comprising: forming an optical signal storage region in a semiconductor substrate; forming a signal detecting region in the semiconductor substrate apart from the optical signal storage region; forming a source/drain of a transistor in the semiconductor substrate; forming a conductive material film on the semiconductor substrate through an insulator; patterning the conductive material film to form a gate electrode of a transistor, the transistor electrically connects the optical signal storage region with the signal detecting region; forming a light shielding film over the signal detecting region; and forming a wiring connected with the signal detecting region.

DETAILED DESCRIPTION OF THE INVENTION

Figure 1:
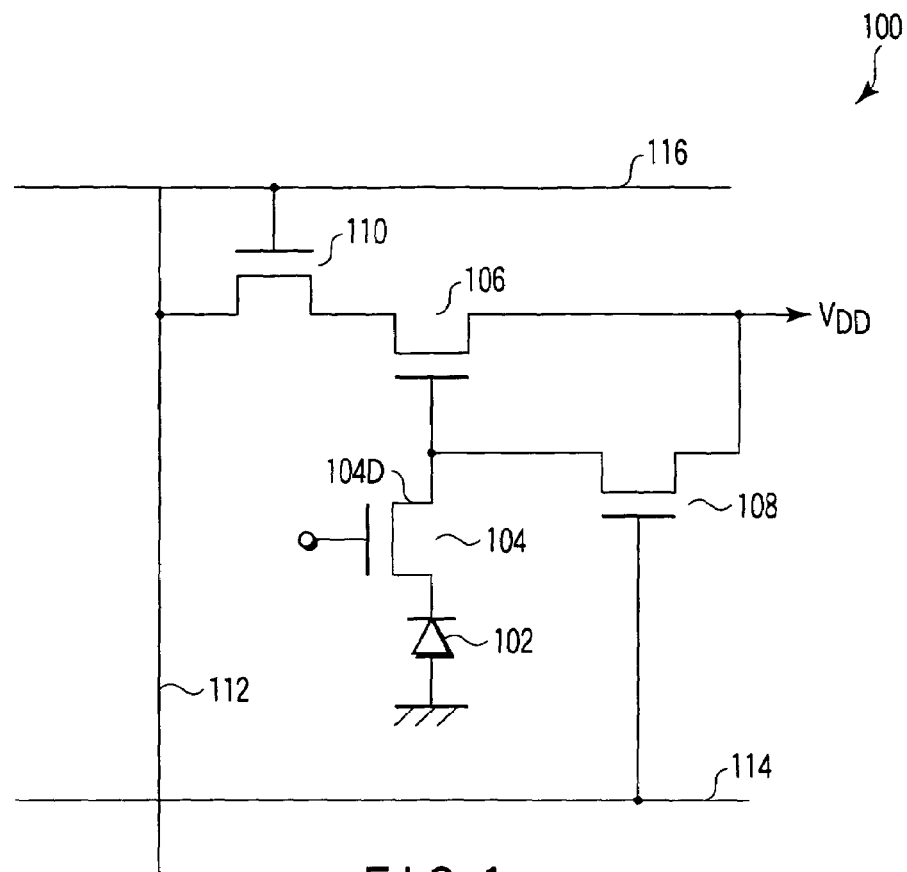
FIG. 1 is an equivalent circuit diagram of a pixel cell of a typical amplifying type MOS solid-state imaging device.

The embodiments of the present invention will be described with reference to the accompanying drawings. Throughout the drawings, corresponding portions are denoted by corresponding reference numerals. Each of the following embodiments is illustrated as one example, and therefore the present invention can be variously modified and implemented without departing from the spirits of the present invention.

The present invention provides a CMOS solid-state imaging device which realizes the global shutter of images and a manufacturing method thereof.

First Embodiment

A first embodiment is a solid-state imaging device which suppresses the problem of crosstalk by providing a new light shielding film in close proximity and above a signal detecting region formed in a surface layer of a semiconductor substrate.

Figure 2A:
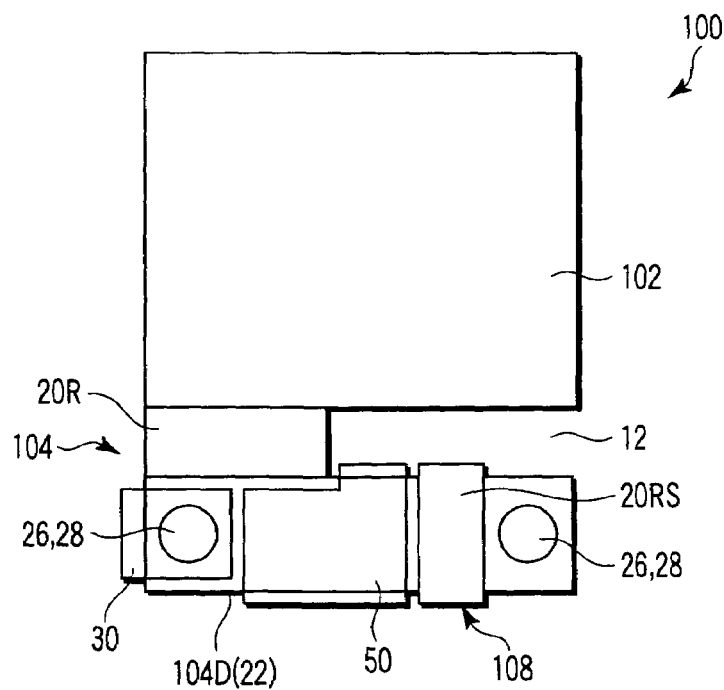
FIGS. 2A and 2B are views illustrating an example of a first embodiment of the present invention.
Figure 2B:
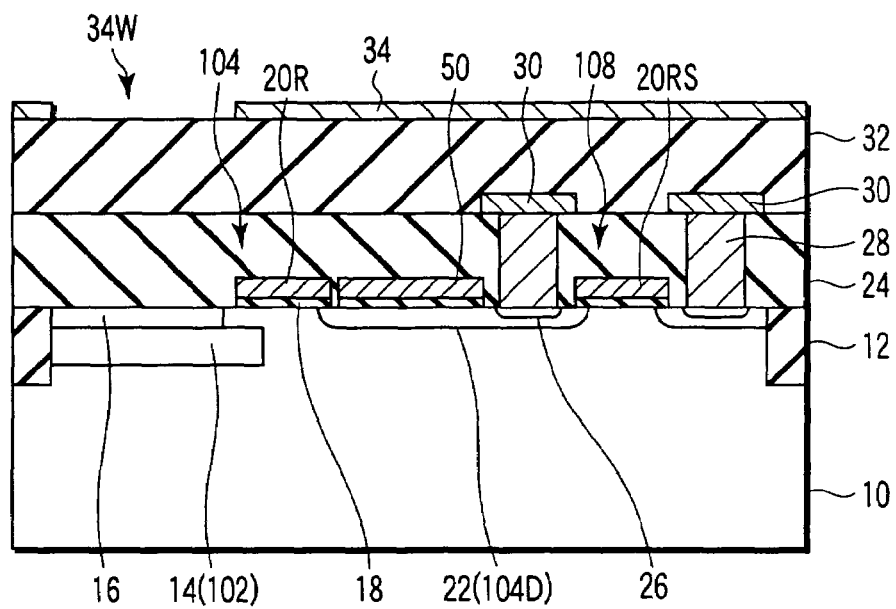

FIGS. 2A and 2B show an example of an essential part of a pixel cell 100 of an MOS solid-state imaging device according to the first embodiment of the present invention. FIG. 2A is a plan layout chart, in which the pixel cell 100 includes a photodiode 102, a read transistor 104, a reset transistor 108 and others. FIG. 2B is a schematic view of a cross-sectional configuration of the pixel cell 100 to facilitate an illustration and including cross sections of the photodiode 102, the read transistor 104 and the reset transistor 108, wherein they are cross sections which do not actually exist (this is also true for views illustrating cross-sectional configurations which will be described later). The photodiode 102 is a photoelectric converting section which converts incident light into an electric signal, and serves as an optical signal storage region which stores an optical signal. The read transistor 104 transfers an image signal stored in the optical signal storage region to its drain 104D (22). The drain 104D (22) of the read transistor 104 serves as a signal detecting region which temporarily stores the image signal, i.e., an electric charge. The reset transistor 108 drains off the electric charge in the signal detecting region 104D (22). In the embodiment, a first light shielding film 50 is provided above the signal detecting region 104D (22) in close proximity to prevent scattered light from straying into the signal detecting region, thereby achieving the global shutter of images. Specifically, a most part above the signal detecting region 104D (22) except around a contact plug 28 is covered with the first light shielding film 50. The first light shielding film 50 according to the embodiment is formed of the same polysilicon film layer as a gate electrode 20R of the read transistor 104.

An example of a manufacturing method of the MOS solid-state imaging device according to the embodiment will now be described with reference to views illustrating cross-sectional configurations depicted in FIGS. 3A to 3E.

Figure 3A:
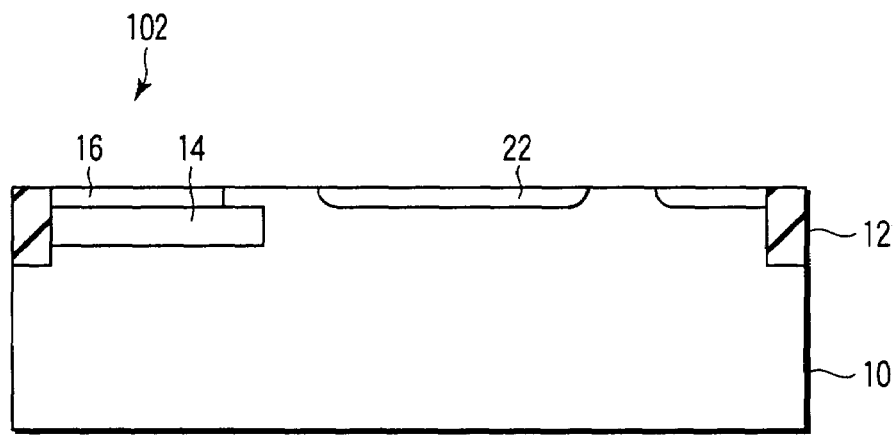
FIGS. 3A to 3E are process cross-sectional views illustrating an example of a manufacturing process of the first embodiment of the present invention.

First, referring to FIG. 3A, a well (not shown) and an isolation 12 are formed in a semiconductor substrate 10, e.g., a silicon substrate. Although it is preferable to use a shallow trench isolation (STI) as the isolation in view of miniaturization, any other isolation technology, e.g., a local oxidation of silicon (LOCOS) can be likewise used.

A region except a region where the photodiode 102 is to be formed is covered with a resist (not shown) and an n-type dopant, e.g., phosphorous (P), is ion-implanted, thereby forming an n-type diffused layer 14. Further, a p-type dopant, e.g., boron (B), is ion-implanted with a high concentration in a surface portion of the n-type diffused layer 14, thus forming a p-type diffused layer 16. The n-type diffused layer 14 photo-electrically converts received light to generate an electric charge corresponding to a light intensity. The p-type diffused layer 16 serves as a surface shield layer.

Furthermore, a region except regions where the drain 22 of the read transistor 104 and a source/drain of any other transistor in the pixel cell 100 are to be formed is covered with a resist (not shown). Then an n-type dopant, e.g., phosphorous, is ion-implanted using the resist as a mask, thereby forming the drain 22. The drain 22 of the read transistor 104 serves as the signal detecting region 104D. The drain 22 of the read transistor 104 and the source/drain of any other transistors can be formed simultaneously or at separate steps. In this manner, a configuration shown in FIG. 3A can be formed.

Figure 3B:
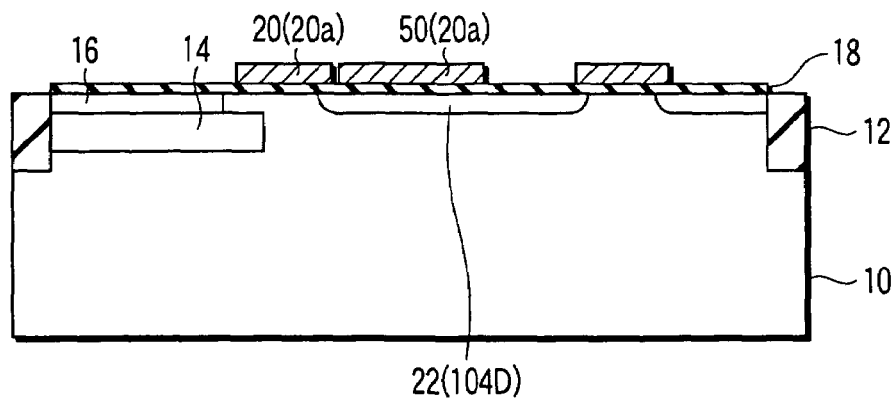

Then, referring to FIG. 3B, a gate insulator 18 is formed on an entire surface on the silicon substrate 10. As the gate insulator 18, it can be used a silicon oxide film ($SiO_2$ film) formed by thermal oxidation, for example. A polysilicon film 20a is formed on an entire surface of the gate insulator 18. As the polysilicon film 20a, it can be used a polysilicon film doped with, e.g., phosphorous at a high concentration. The polysilicon film 20a is patterned by lithography and etching to form a gate electrode 20. At the same time, as shown in FIG. 3B, the first light shielding film 50 is formed over the drain 22 (the signal detecting region 104D) of the read transistor 104 except a region where a contact is to be formed. At a part where the drain 22 is in contact with the isolation 12, it is preferable to form the first light shielding film 50 above the isolation 12 beyond the boundary as shown in FIG. 2A. In this manner, a configuration shown in FIG. 3B can be formed.

Figure 3C:
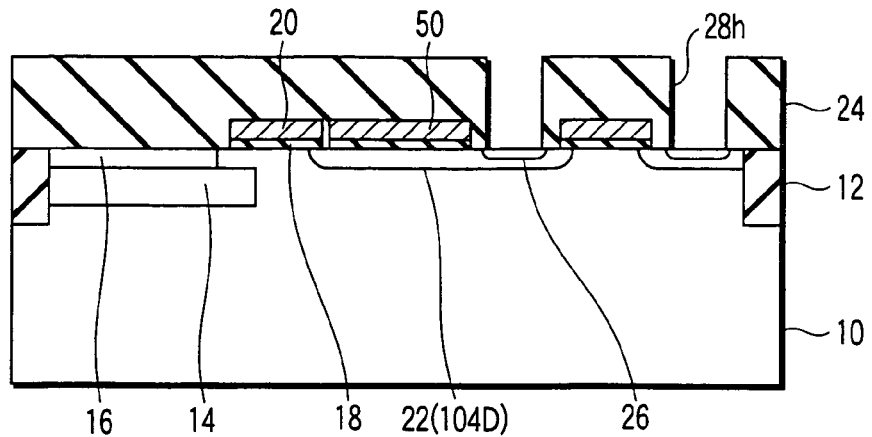

Then, referring to FIG. 3C, a first interlevel insulator 24 is deposited on the entire surface. As the first interlevel insulator 24, it can be used, e.g., $SiO_2$ film formed by chemical vapor deposition (CVD). Moreover, a surface of the first interlevel insulator 24 is planarized by, e.g., chemical-mechanical polishing (CMP). Additionally, the first interlevel insulator 24 is patterned by lithography and etching to form a contact hole 28h therein. Then, an n-type dopant, e.g., phosphorous is ion-implanted into the silicon substrate 10 on a bottom surface of the contact hole 28h, thereby forming a contact region 26. In this manner, a configuration shown in FIG. 3C can be formed.

Figure 3D:
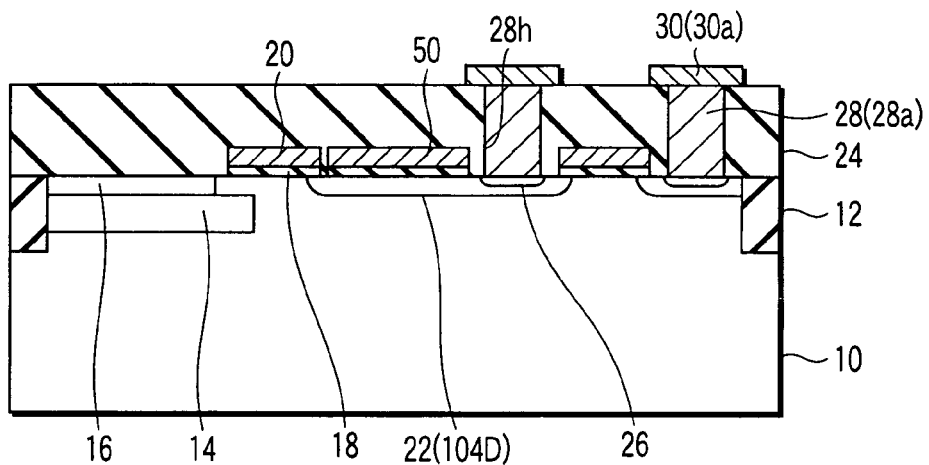

Then, referring to FIG. 3D, for example, tungsten (W) 28a is deposited by, e.g., CVD on an entire surface to fill the contact hole 28h. The CVD-W film 28a deposited on the surface of the first interlevel insulator 24 is removed, thereby forming a contact plug 28. Furthermore, a first aluminum (Al) film 30a is deposited on the entire surface by, e.g., sputtering. Next, the first Al film 30a is patterned by lithography and etching to form an Al wiring 30. In this manner, a configuration shown in FIG. 3D can be formed.

Figure 3E:
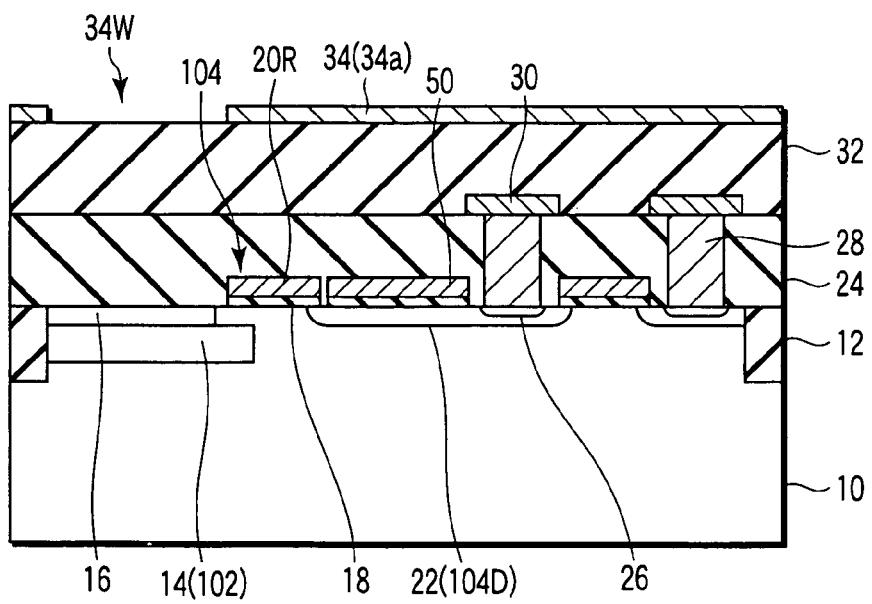

Then, referring to FIG. 3E, a second interlevel insulator 32 is deposited on the entire surface including over the Al wiring 30. As the second interlevel insulator 32, CVD-$SiO_2$ film can be used like the first interlevel insulator 24. Next, the second interlevel insulator 32 is planarized by, e.g., CMP, and then a second Al film 34a is deposited on the entire surface by, e.g., sputtering. The second Al film 34a serves as a second light shielding film 34. A window 34W is provided in the second Al film 34a at a part corresponding to the photodiode 102 by lithography and etching.

As described above, the pixel cell 100 according to the embodiment shown in FIG. 3E is brought to completion, in which most part above the drain 22 (the signal detecting region 104D) of the read transistor 104 is covered with the first light shielding film 50.

Covering the most part above the drain 22 with the first light shielding film 50 in this manner can prevent stray light from entering into the drain 22 which is the signal detecting region. For example, the stray light is reflected in the vicinity of the optical signal storage region 14 of the photodiode 102, such as a surface of the gate electrode 20R of the read transistor 104.

Figure 4:
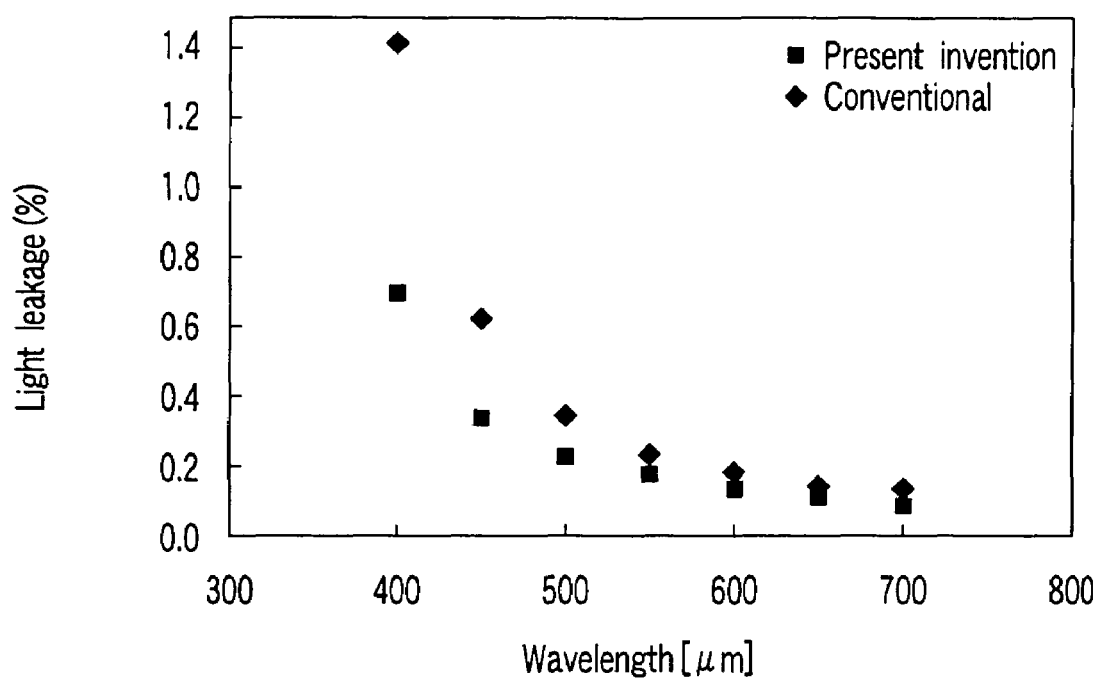
FIG. 4 is a graph showing a relationship between an amount of light leakage and an incident light wavelength according to the first embodiment.

FIG. 4 is a graph showing an effect of light leakage suppression according to the embodiment. In the graph, a horizontal axis represents a wavelength of light, and a vertical axis represents an amount of light leakage. Square marks in the drawing indicate an example of the present embodiment, and diamond marks indicate an example of a conventional art. Amount of light leakage depends on wavelength, and the amount of leakage increases as the wavelength reduces. According to the embodiment, an amount of leakage in a short wavelength region can be effectively suppressed and reduced to substantially ½ of the conventional art.

Although FIG. 4 shows the example where the polysilicon film is used as the first light shielding film 50, it can be also used a hemi-spherical grain (HSG) film having hemi-spherical polysilicon crystal grains, a tantalum nitride (TaN) film, or a silicide film of a refractory metal, e.g., molybdenum silicide (MoSi), tungsten silicide (WSi), titanium silicide (TiSi), cobalt silicide (CoSi) or nickel silicide (NiSi). Further, it can be used a laminated film consisting of two or more films from one of the polysilicon film and the silicide film or from one or more of these films and the TaN film. Since the above-described film has a high reflectance and/or a low transmittance of light, using such a film can reduce an amount of leakage of light which reaches the signal detecting region 104D through the first light shielding film 50.

Figure 5:
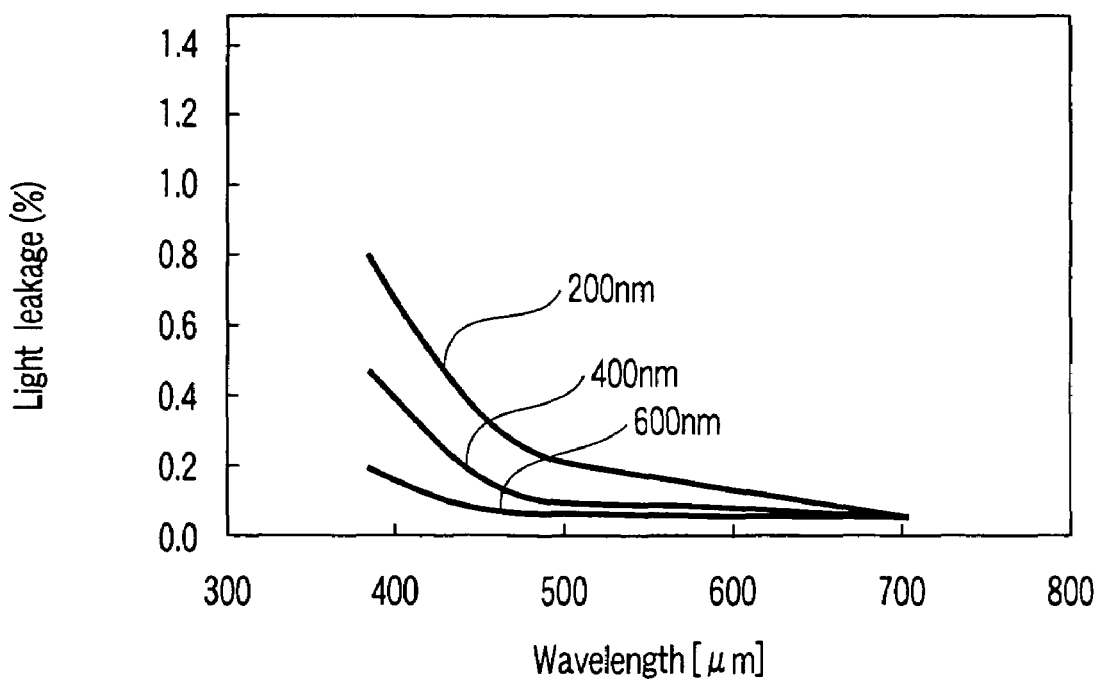
FIG. 5 is a graph showing a relationship between a thickness of a light shielding film and an amount of light leakage according to the first embodiment.

In the example of FIG. 4, the polysilicon film having a thickness of 200 nm is used as the first light shielding film 50. When the thickness of the polysilicon film is increased, a light shielding effect can be improved. FIG. 5 is a graph showing such an example. The graph shows cases where the thickness of the polysilicon film is 200 nm, 400 nm and 600 nm, respectively. When the thickness of the polysilicon film is increased n times, an amount of light leakage is exponentially decreased to substantially $½^n$.

As described thus far, the embodiment can provide the amplifying type MOS solid-state imaging device which can suppress leakage of stray light into the signal detecting section and is superior in the global shutter of images.

The configuration and the manufacturing method according to the present invention can be modified and carried out in many ways. Some of such modifications will now be described with reference to FIGS. 6A and 6B to FIGS. 11A and 11B.

First Modification

Figure 6A:
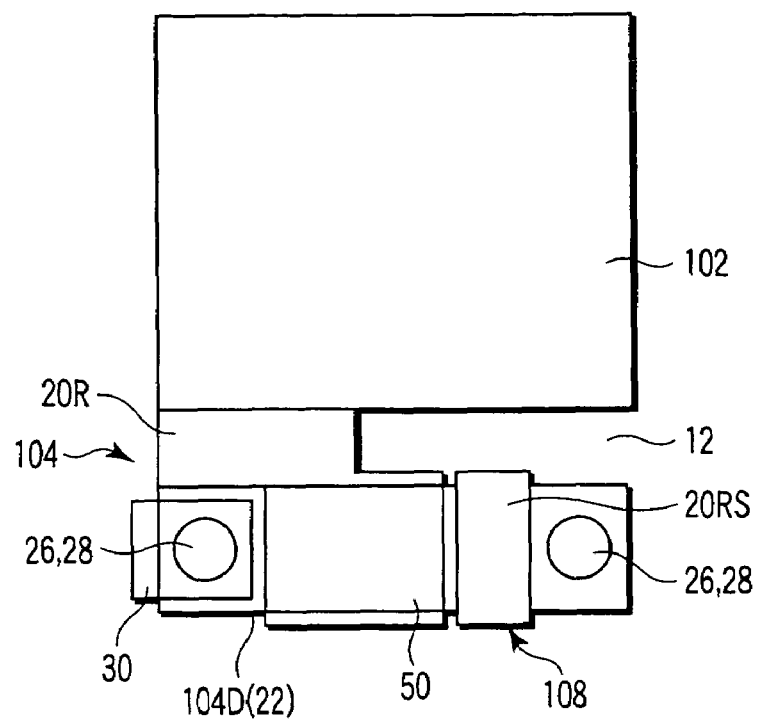
FIGS. 6A and 6B are views illustrating a first modification of the first embodiment.
Figure 6B:
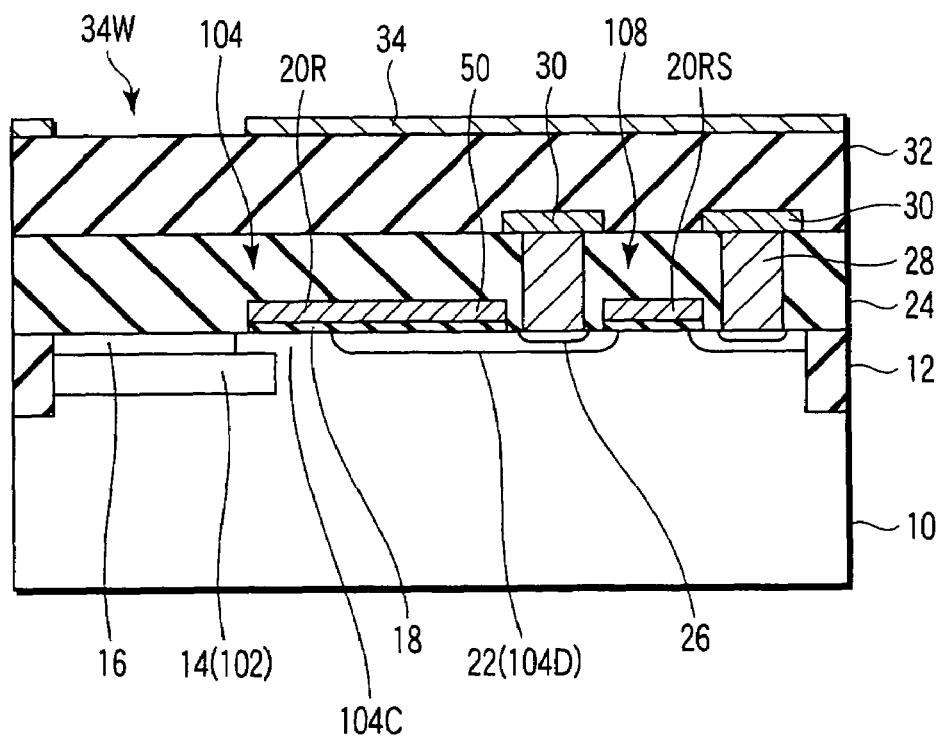

A first modification is an example in which a first light shielding film 50 is formed integrally with a gate electrode 20R of the read transistor 104 as shown in FIGS. 6A and 6B. FIG. 6A is a plan layout chart, and FIG. 6B is a view illustrating a cross-sectional configuration. The first light shielding film 50 integrally formed with the gate electrode 20R of the read transistor 104 is formed to cover the channel region 104C and most region of the drain 22 of the read transistor 104 continuously. Even if the first light shielding film 50 is integrally formed with the gate electrode 20R of the read transistor 104 in this manner, when the read transistor 104 is turned on, a channel is formed in the channel region 104C alone, and hence an operation of the read transistor 104 is not affected. Thereby, coverage of the drain 22, i.e., the signal detecting section 104, by the first light shielding film 50 can be increased. Accordingly, leakage of light into the signal detecting section can be suppressed equivalently with or more than that of the first embodiment, thereby providing the amplifying type MOS solid-state imaging device which is superior in the global shutter of images.

Second Modification

Figure 7A:
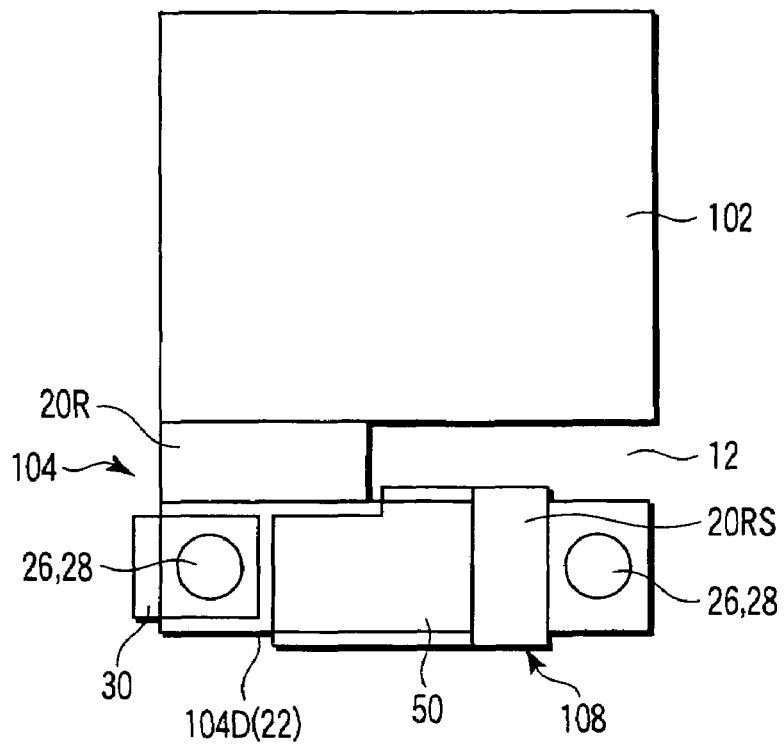
FIGS. 7A and 7B are views illustrating a second modification of the first embodiment.
Figure 7B:
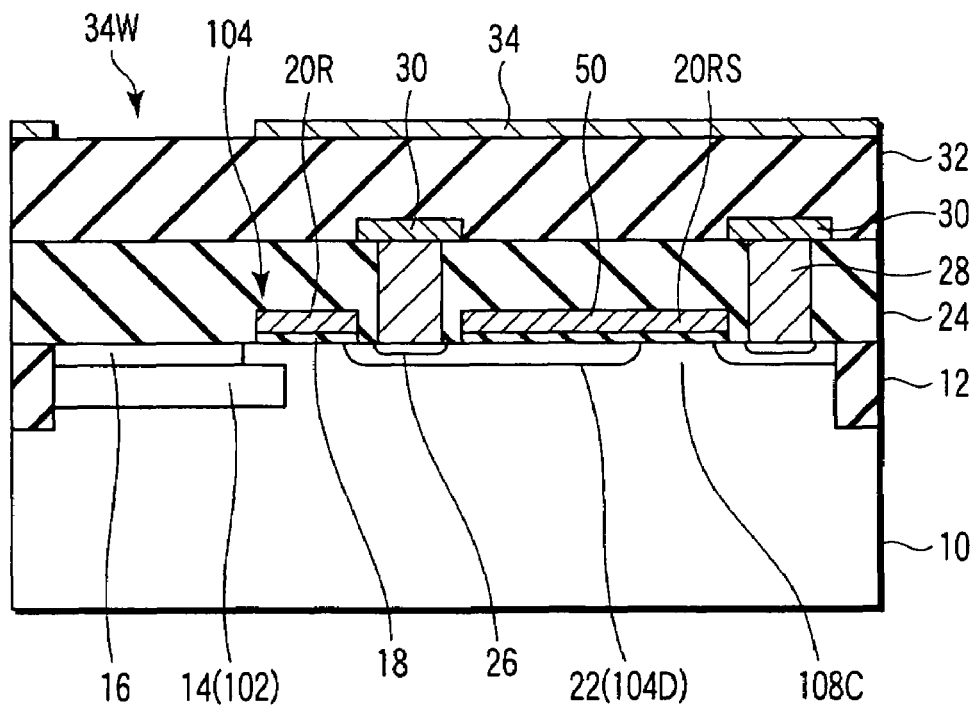

A second modification is an example in which a first light shielding film 50 is formed integrally with a gate electrode 20RS of the reset transistor 108 as shown in FIGS. 7A and 7B. FIG. 7A is a plan layout chart, and FIG. 7B is a view illustrating a cross-sectional configuration. The first light shielding film 50 integrally formed with the gate electrode 20RS of the reset transistor 108 is formed to cover the channel region 108C and most region of the drain 22 of the read transistor 104 continuously. Even if the first light shielding film 50 is formed in this manner, an operation of the reset transistor 108 is not affected at all like the first modification. In this example, likewise, leakage of light into the signal detecting section can be suppressed equivalently with or more than that of the first embodiment, thereby providing the amplifying type MOS solid-state imaging device which is superior in the global shutter of images.

Third Modification

Figure 8A:
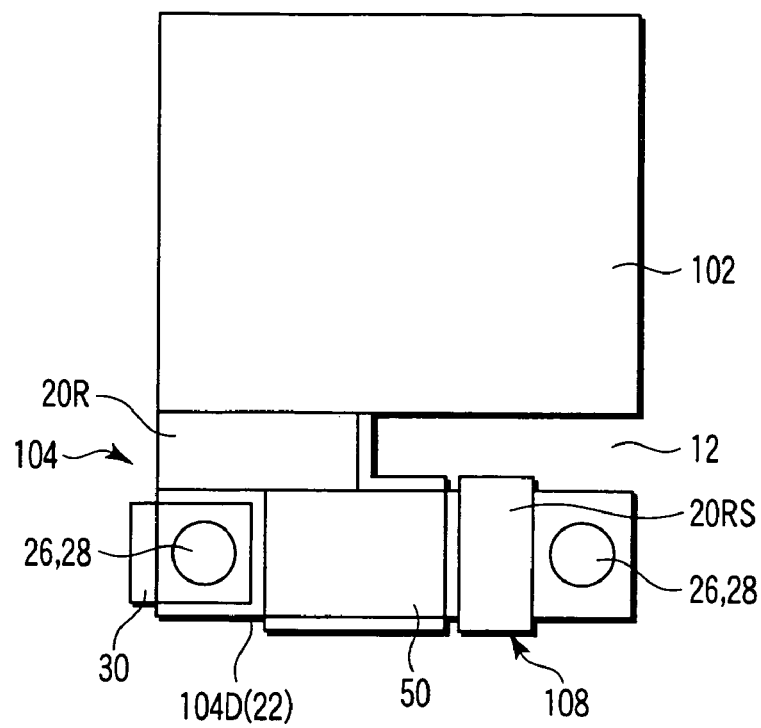
FIGS. 8A and 8B are views illustrating a third modification of the first embodiment.
Figure 8B:
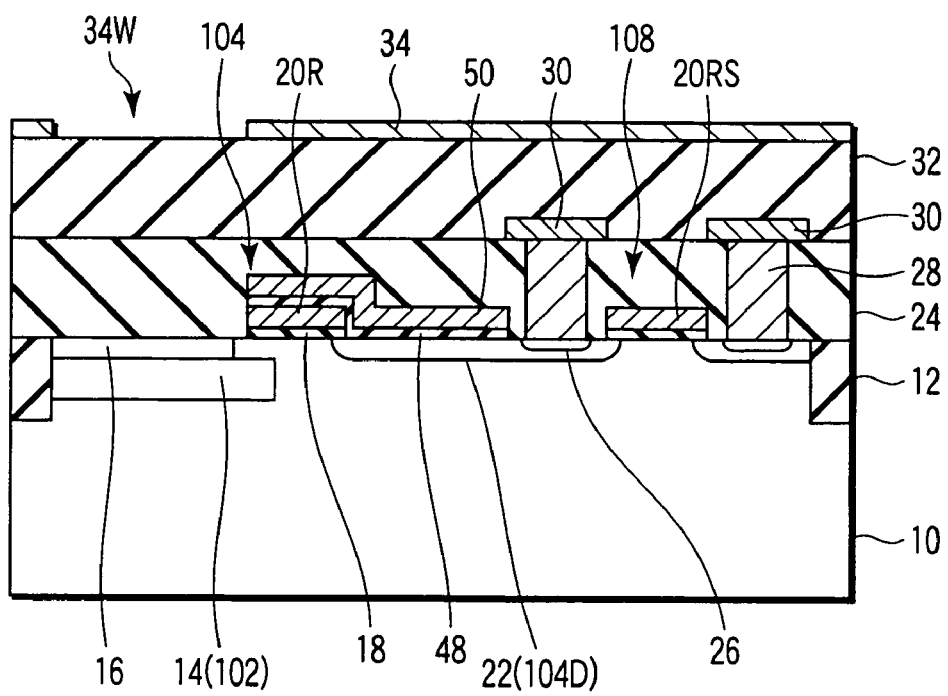

A third modification is an example in which a first light shielding film 50 is formed of a second silicon film different from the gate electrodes 20R, 20RS of the read transistor 104 and the reset transistor 108 as shown in FIGS. 8A and 8B. FIG. 8A is a plan layout chart, and FIG. 8B is a view illustrating a cross-sectional configuration. The first light shielding film 50 is extendingly formed to cover the gate electrode 20R of the read transistor 104 through an insulator 48 in an overlapping manner, and also to cover most region of the signal detecting section 104D (the drain 22). Forming the first light shielding film 50 in this manner, a light leakage can be suppressed effectively equivalent to that in the first modification.

Fourth Modification

Figure 9A:
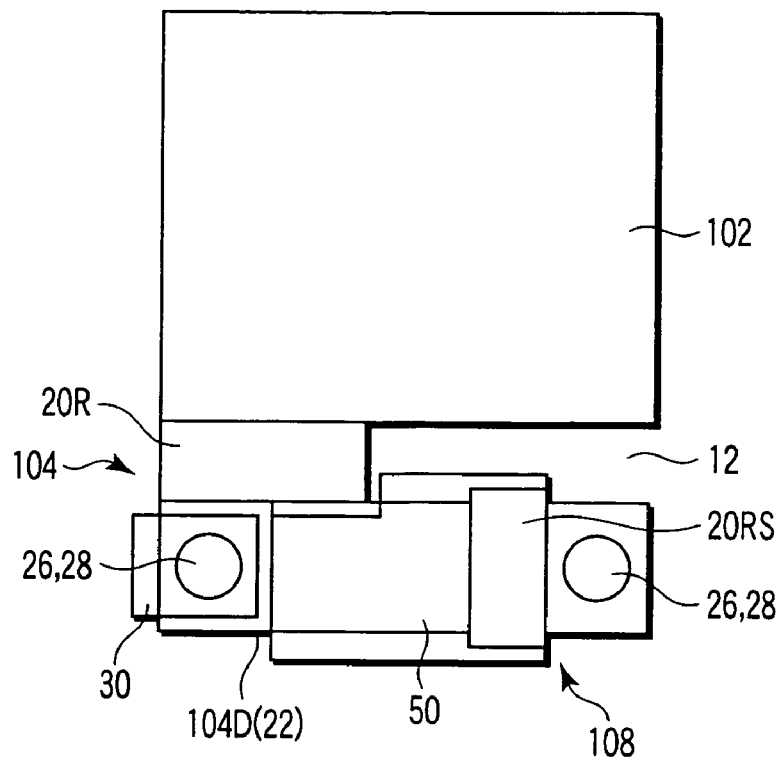
FIGS. 9A and 9B are views illustrating a fourth modification of the first embodiment.
Figure 9B:
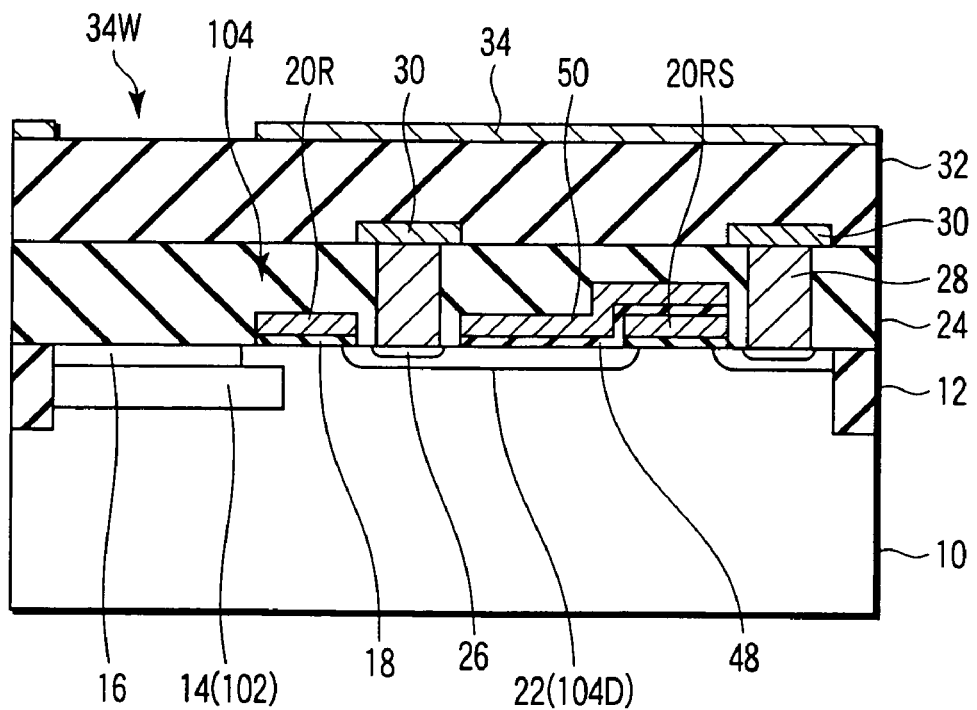

A fourth modification is another example of a first light shielding film 50 formed of a second silicon film like the third modification, as shown in FIGS. 9A and 9B. FIG. 9A is a plan layout chart, and FIG. 9B is a view illustrating a cross-sectional configuration. The first light shielding film 50 is extendingly formed to cover the gate electrode 20RS of the reset transistor 108 and most part of the signal detecting section 104D (the drain 22 of the read transistor 104) through an insulator 48. Forming the first light shielding film 50 in this manner, a light leakage can be suppressed effectively equivalent to that in the second modification.

Fifth Modification

Figure 10A:
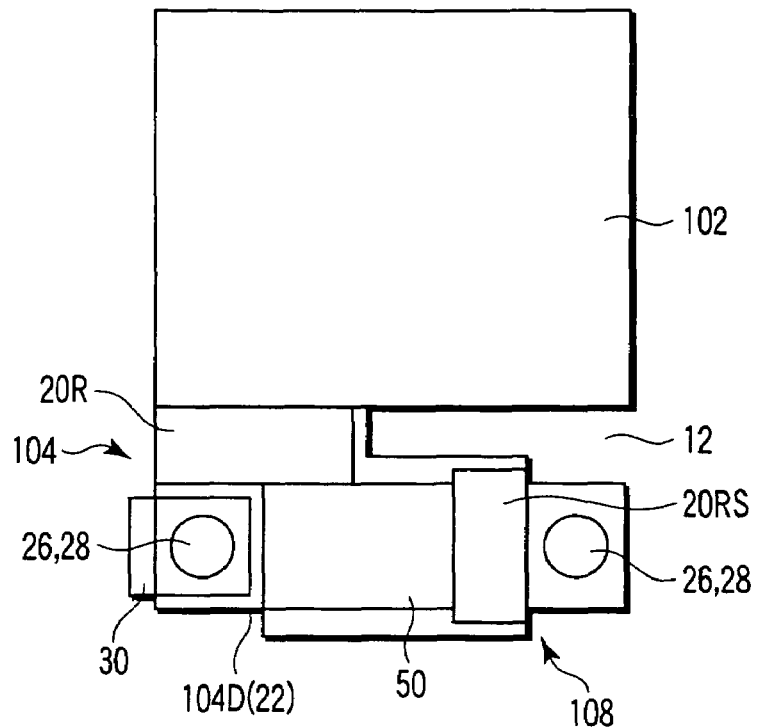
FIGS. 10A and 10B are views illustrating a fifth modification of the first embodiment.
Figure 10B:
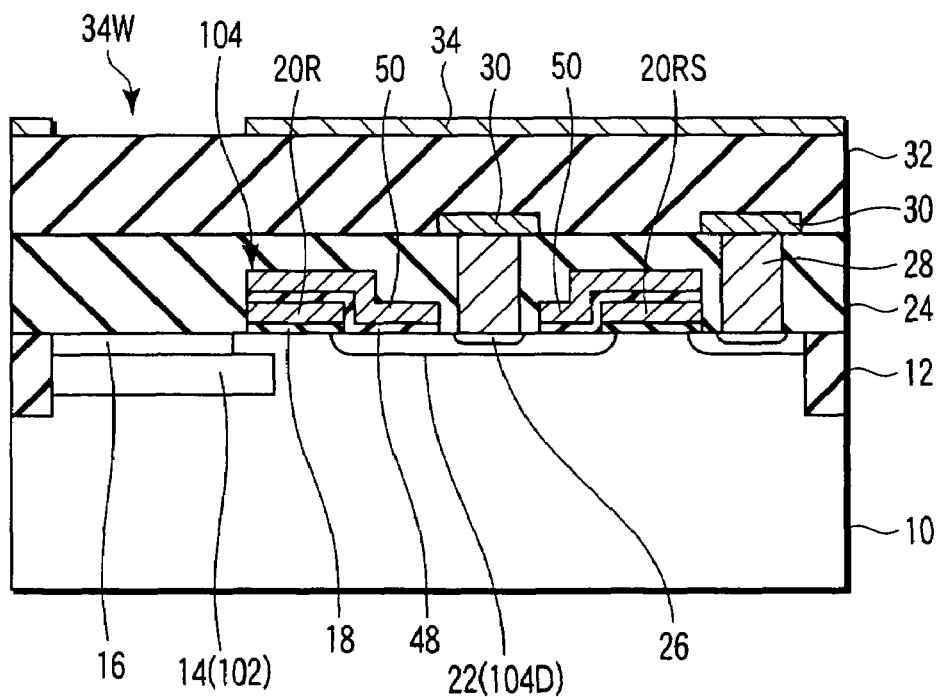

A fifth modification is still another example of a first light shielding film 50 formed of a second silicon film like the third and fourth modifications, as shown in FIGS. 10A and 10B. FIG. 10A is a plan layout chart, and FIG. 10B is a view illustrating a cross-sectional configuration. In this modification, a thin insulator 48 is formed on an entire surface before forming the second silicon film. Then, the second silicon film is deposited on the insulator 48 and patterned by lithography and etching to form the first light shielding film 50. The first light shielding film 50 is extendingly formed to cover the gate electrodes 20R and 20RS of the read transistor 104 and the reset transistor 108 and most part of the signal detecting section 104D. Forming the first light shielding film 50 in this manner, it can be eliminate gaps between either gate electrode 20R or 20RS of the read transistor 104 or the reset transistor 108 and the first shielding film 50 which exist in the foregoing embodiment and first to fourth modifications, thus further increasing coverage of the signal detecting section 104D.

Sixth Modification

Figure 11A:
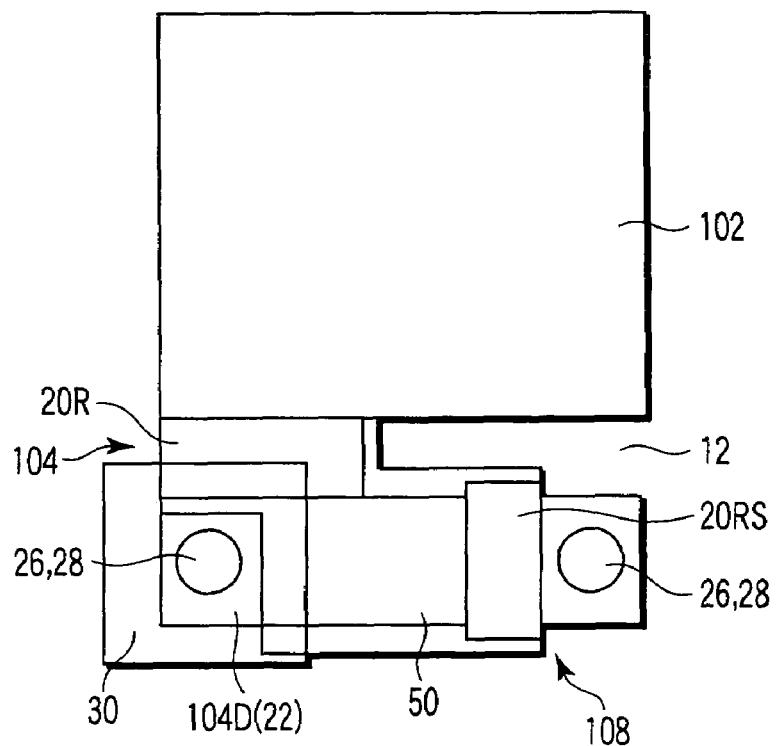
FIGS. 11A and 11B are views illustrating a sixth modification of the first embodiment.
Figure 11B:
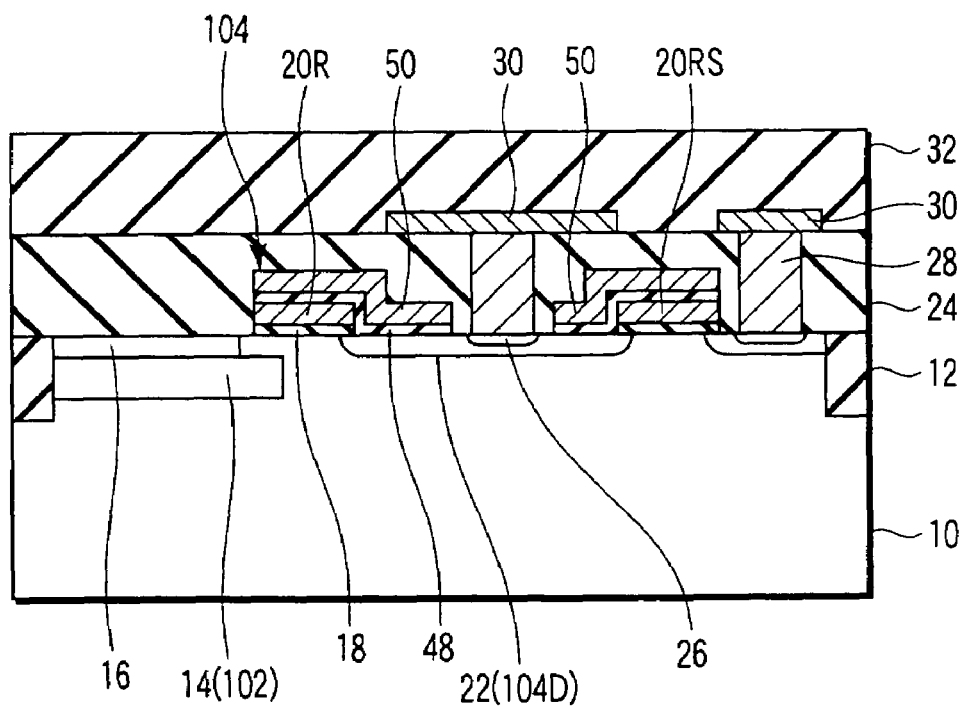

By increasing coverage of the signal detecting section 104D by a first light shielding film 50, it can be eliminated the second light shielding film 34 formed above the Al wiring 30. Such an example is shown in FIGS. 11A and 11B. FIG. 11A is a plan layout chart, and FIG. 11B is a view illustrating a cross-sectional configuration. In this example, the configuration shown in FIG. 10 described in conjunction with the fifth modification is further modified. The first light shielding film 50 is extendingly formed to cover the gate electrodes 20R and 20RS of the read transistor 104 and the reset transistor 108 and most part of the signal detecting section 104D, but it is not restricted to this configuration. Since, in the signal detecting section 104D, a contact plug 28 cannot be connected with the first light shielding film 50, there is a region around the contact plug 28 where the first light shielding film 50 cannot be covered. If the second light shielding film 34 is eliminated, then undesired stray light enters from a gap which is the region not covered with the first light shielding film 50 around the contact plug 28 so that an electric charge stored in the signal detecting section 104D is caused to change. In order to avoid this, in this modification, the gap which is not covered with the first light shielding film 50 around the contact plug 28 is reduced, and an Al wiring 30 connected with the contact plug 28 is formed sufficiently wide, thereby improving light shielding efficiency in the signal detecting region 104D around the contact plug 28.

The Al wiring 30 can be widely formed like a light shielding film and entirely cover the gap around the contact plug 28. According to the modification, a manufacturing process can be simplified by eliminating the second light shielding film 34.

Second Embodiment

Figure 12A:
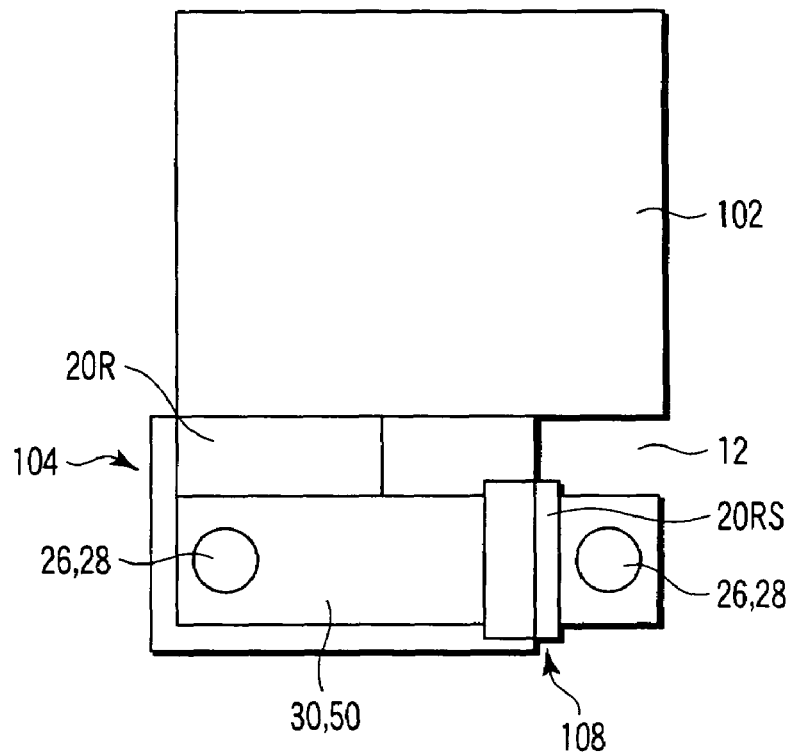
FIGS. 12A and 12B are views illustrating an example of a second embodiment of the present invention.
Figure 12B:
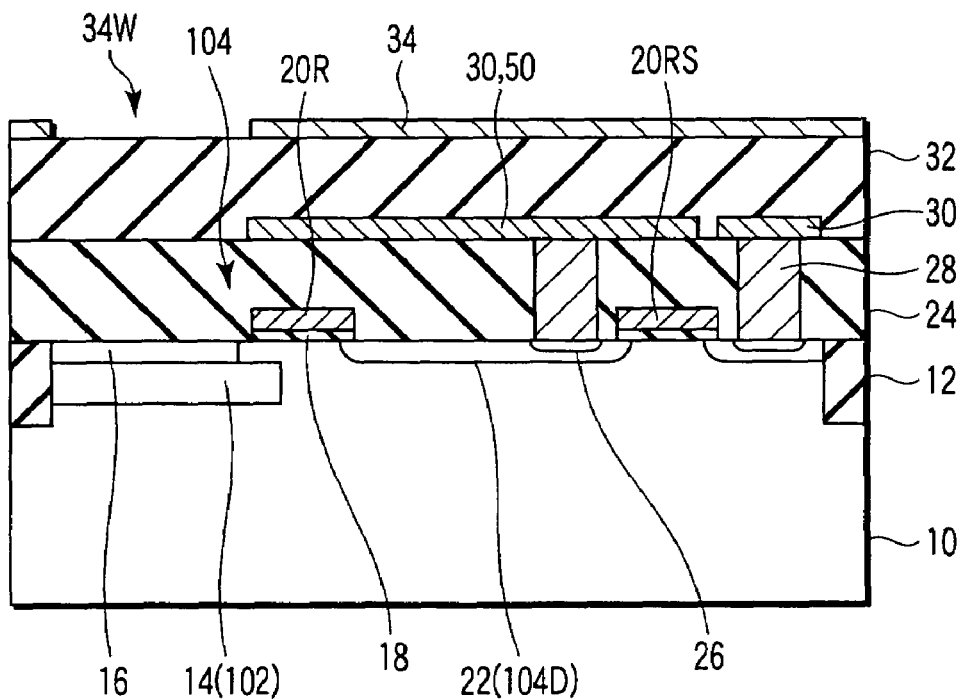

A second embodiment is an example in which a first light shielding film 50 is formed by utilizing a wiring, e.g., an Al wiring 30 as shown in FIGS. 12A and 12B. FIG. 12A is a plan layout chart, and FIG. 12B is a view illustrating a cross-sectional configuration. The Al wiring 30 which is connected with the drain 22 (the signal detecting section 104) of the read transistor 104 can be formed in a large area over the gate electrodes 20R, 20Rs of the read transistor 104 and the reset transistor 108. In this configuration, the entire signal detecting section 104 can be covered with the first light shielding film 50 utilizing the Al wiring 30.

Seventh Modification

Figure 13A:
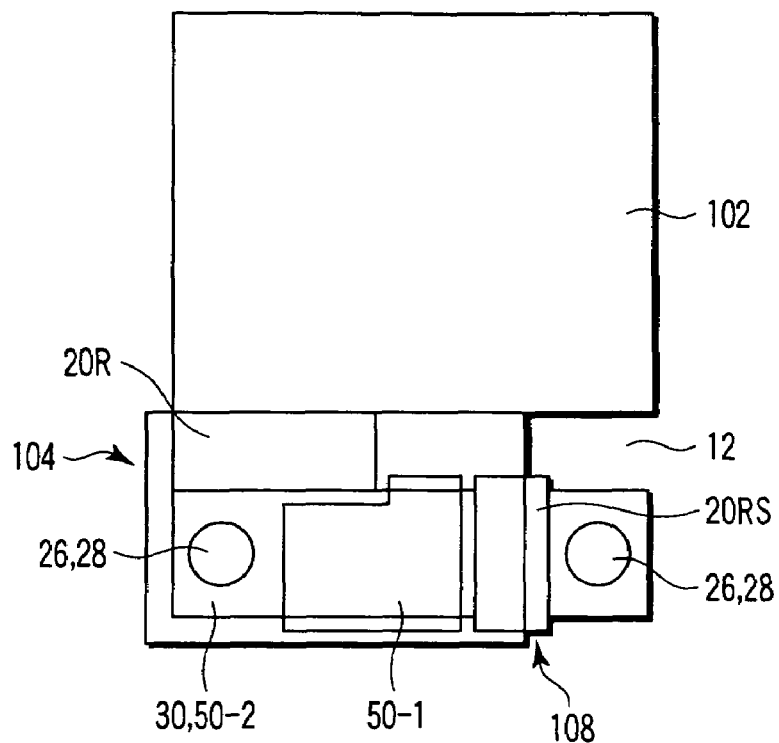
FIGS. 13A and 13B are views illustrating a seventh modification of the second embodiment.
Figure 13B:
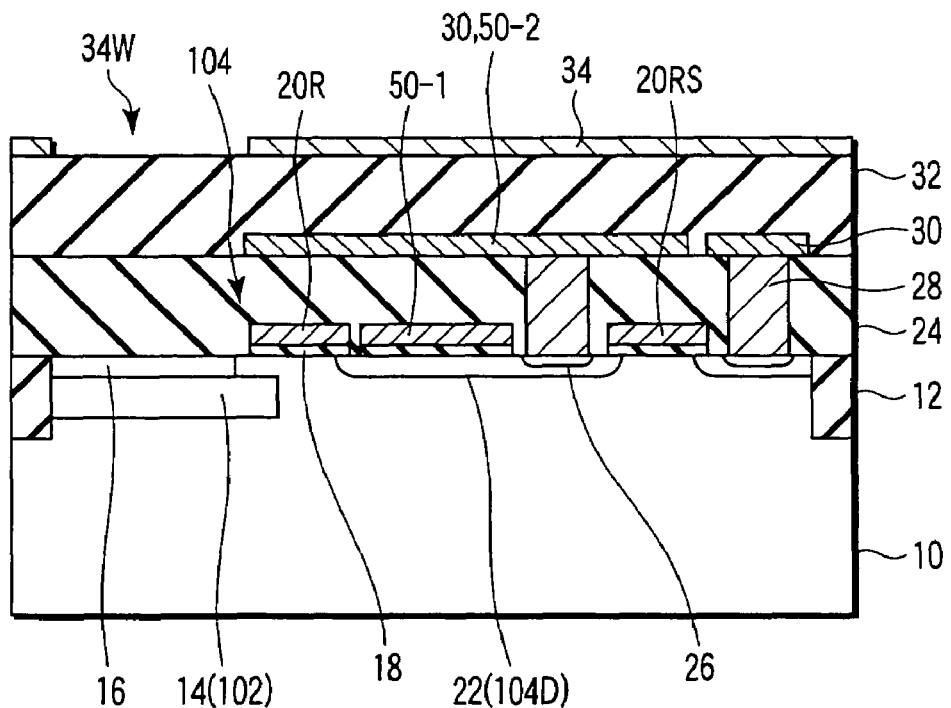

A seventh modification is carried out by combining the second embodiment with the first embodiment or one of the first to sixth modifications. FIGS. 13A and 13B show an example in which the second embodiment is combined with the first embodiment. As shown in the drawings, a first light shielding film 50 can be formed as a double-layer structure comprising a light shielding film 50-1 formed of the gate electrode material film and a light shielding film 50-2 formed of the wiring material film.

As described herein above, although the present invention has been described while taking the example of the three-layer structure including the first light shielding film 50, the Al wiring 30 and the second light shielding film 34, the present invention can be likewise applied to a semiconductor device having a multi-level wiring consisting of three or more levels. Here, the first light shielding film 50 is referred to as a first wiring layer; the Al wiring 30 is referred to as a second wiring layer; and the second light shielding film 34 is referred to as a third wiring layer. In a multi-level wiring including three or more levels, although it is preferable for the first wiring layer to be a wiring of a lowermost level in the multi-level wiring, the first wiring layer can be formed of a wiring of any lower level in the multi-level wiring close to a semiconductor substrate. The second wiring layer may be any level as long as it is an intermediate level except the lowermost level and the uppermost level in the multi-level wiring, and above the first wiring layer. It is good enough for the third wiring layer to be an upper level in the multi-level wiring above the second wiring layer, and it may be the uppermost level. Furthermore, as the third wiring layer, a film having light shielding capability which is formed separately from the multi-level wiring and formed above the uppermost wiring level can be utilized. In one embodiment of the present invention, it is implemented by forming light shielding films with these first and third wiring layers over the signal detecting region.

As described above, according to the present invention, it can be suppressed leakage of reflected stray light, i.e., crosstalk, from a constituent element, e.g., an adjacent gate electrode, to the signal detecting section which temporarily stores image information. Accordingly, the solid-state imaging device achieving the global shutter of images and its manufacturing method can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state imaging device comprising:
    an optical signal storage region provided in a semiconductor substrate;
    a signal detecting region provided in the semiconductor substrate apart from the optical signal storage region;
    a transistor electrically connecting the optical signal storage region with the signal detecting region and including a gate electrode provided on an insulator on the semiconductor substrate;
    a wiring directly connected with the signal detecting region; and
    a light shielding film provided directly on the insulator on the signal detecting region and to cover the signal detecting region.

2. The solid-state imaging device according to claim 1, further comprising:

a second light shielding film provided above the wiring and including a window corresponding to the optical signal storage region.

3. The solid-state imaging device according to claim 1, wherein the light shielding film is one of a silicon film, a silicide film and a laminated film consisting of these films.

4. A manufacturing method of a solid-state imaging device, comprising:

forming an optical signal storage region in a semiconductor substrate;

forming a signal detecting region in the semiconductor substrate apart from the optical signal storage region;

forming a source/drain of a transistor in the semiconductor substrate;

forming a conductive material film on an insulator on the semiconductor substrate;

patterning the conductive material film to form a gate electrode of a transistor and a light shielding film, the transistor electrically connecting the optical signal storage region with the signal detecting region, and the light shielding film covering the signal detecting region; and forming a wiring connected with the signal detecting region.

5. The manufacturing method of a solid-state imaging device according to claim 4, further comprising:

forming a second light shielding film above the wiring and including a window corresponding to the optical signal storage region.

* * * * *